United States Patent
Song

[11] Patent Number: 5,808,366
[45] Date of Patent: Sep. 15, 1998

[54] INTEGRATED CIRCUITS, AND METHODS OF FABRICATING SAME, WHICH TAKE INTO ACCOUNT CAPACITIVE LOADING BY THE INTEGRATED CIRCUIT POTTING MATERIAL

[75] Inventor: Minkyu Song, Seoul, Rep. of Korea

[73] Assignee: Samsung Electronics Co., Ltd., Suwon, Rep. of Korea

[21] Appl. No.: 694,541

[22] Filed: Aug. 9, 1996

[30] Foreign Application Priority Data

Nov. 10, 1995 [KR] Rep. of Korea ............... 1995-40800

[51] Int. Cl.⁶ .................................. H01L 23/31
[52] U.S. Cl. ................ 257/794; 257/650; 257/923; 257/635; 257/787
[58] Field of Search .................... 257/923, 787, 257/794, 790, 635, 644, 650, 752

[56] References Cited

U.S. PATENT DOCUMENTS 3,838,442 9/1974 Humphreys ..................... 257/752

OTHER PUBLICATIONS

Nguyen et al., *Effects of Die Coatings, Mold Compounds, and Test Conditions on Temperature Cycling Failures,* IEEE Transactions on Components, Packaging, and Manufacturing Technology—Part A, vol. 18, No. 1, Mar. 1995, pp. 15–22.

*Primary Examiner*—Jerome Jackson
*Assistant Examiner*—John Guay
*Attorney, Agent, or Firm*—Myers Bigel Sibley & Sajovec

[57] ABSTRACT

High speed integrated circuits are designed and fabricated by taking into account the capacitive loading on the integrated circuit by the integrated circuit potting material. Line drivers may be sized to drive conductive lines as capacitively loaded by the potting material. Repeaters may be provided along long lines, to drive the lines as capacitively loaded by the potting material. Intelligent drivers may sense the load due to the potting material and drive the lines as capacitively loaded by the potting material. The thickness of the passivating layer on the outer conductive lines may also be increased so as to prevent the potting material from extending between the conductive lines. High speed potted integrated circuits may thereby be provided.

2 Claims, 2 Drawing Sheets

INTEGRATED CIRCUITS, AND METHODS OF FABRICATING SAME, WHICH TAKE INTO ACCOUNT CAPACITIVE LOADING BY THE INTEGRATED CIRCUIT POTTING MATERIAL

FIELD OF THE INVENTION

This invention relates to semiconductor integrated circuits and methods of designing and fabricating same, and more particularly to packaging methods for integrated circuits and methods of designing and fabricating same.

BACKGROUND OF THE INVENTION

Integrated circuits are widely used in consumer, commercial and military applications. As is well known to those having skill in the art, an integrated circuit generally includes a semiconductor die which is potted with a potting material.

More specifically, a plurality of integrated circuits are generally formed on a semiconductor wafer using diffusion, epitaxial growth, ion implantation, deposition, photolithography and many other conventional processes, to fabricate a plurality of microelectronic devices in a microelectronic substrate. A plurality of patterned conductive interconnect (wiring) layers of conductive lines are fabricated on the microelectronic substrate, separated by insulating layers. The conductive layers are generally polysilicon, metal or alloys thereof and the insulating are generally silicon dioxide, silicon nitride or other insulating layers.

The wafer is then diced into chips, also referred to as semiconductor dies. The dies are then fixed onto lead frames and wire bonded to produce electrical connections between bonding pads on the die and the leads in the lead frame.

Then, the die and lead frame are potted with a potting material such as a potting compound resin. The potting material protects the semiconductor die from external effects, such as moisture and mechanical shock. The potting material may also help to transfer heat from the semiconductor die, and also electrically insulates the semiconductor die. To perform these functions, the potting compound resins generally have a relatively high permittivity.

Unfortunately, the potting material which covers the semiconductor chip or die may produce a parasitic capacitance between the patterned conductive interconnect lines. For example, when a potting compound such as plastic, ceramic or other resins is formed on the semiconductor die, and penetrates between the conductive regions such as metal lines in the outer layer of the integrated circuit, the potting compound may increase the parasitic capacitance.

As the integration density and the length of the conductive lines in an integrated circuit increase, this increase in parasitic capacitance may produce problems. For example, the performance of the drivers which drive the conductive lines may deteriorate, and the overall operation of the integrated circuit may degrade because the drivers have to drive larger parasitic capacitance than expected.

One technique for solving these problems is described in a publication by Luu T. Nguyen et al. entitled "Effects of Die Coatings, Mold Compounds, and Test Conditions on Temperature Cycling Failures", IEEE Transactions on Components, Packaging and Manufacturing Technology, Part A, Vol. 18, No. 1, Mar. 1995, pp. 15–22. In this publication, an additional protective layer is coated on the integrated circuit, between the patterned conductive interconnect layers and the potting compound. However, the need to form an additional protective layer may increase the cost of the integrated circuit.

SUMMARY OF THE INVENTION

The present invention designs and fabricates integrated circuits including a semiconductor die which is potted with a potting material, by designing and fabricating the semiconductor die to take into account the capacitive effect of the potting material on the performance of the semiconductor die. Accordingly, operating speed of the integrated circuit may be increased, without the need to add additional protective layers, by designing and fabricating the integrated circuit to include the expected increase in parasitic capacitance by the potting material in the design of the integrated circuit itself.

In particular, according to one aspect of the present invention, the semiconductor die includes a plurality of drivers which drive patterned conductive lines at the outer surface of the semiconductor die. The semiconductor die is designed and fabricated by designing and fabricating at least one of the drivers to drive the patterned conductive lines at the outer surface of the semiconductor die, as capacitively loaded by the potting material. According to another aspect of the invention, at least one repeater is designed and fabricated along at least one of the patterned conductive line, to drive the patterned conductive lines at the outer surface of the semiconductor die, as capacitively loaded by the potting material.

In another aspect of the present invention, intelligent drivers may be designed and fabricated in the integrated circuit, to sense the load on at least one of the patterned conductive lines at the outer surface of the semiconductor die, as capacitively loaded by the potting material, and to drive the patterned conductive line at the outer surface of the semiconductor die as capacitively loaded by the potting material.

In yet another aspect of the present invention, the thickness of one or more insulating layer which insulates the conductive interconnect layers from one another is expanded on the outer patterned conductive interconnect layer to fill the spaces between the plurality of conductive regions in the outer patterned conductive layer. The potting material thereby does not extend between the plurality of conductive regions in the outer patterned conductive layer. However, a separate die protective layer as described in the prior art is not required.

An integrated circuit according to the present invention includes a semiconductor die and a potting material on the semiconductor die. The semiconductor die is operatively optimized to take into account the capacitive effect of the potting material on the semiconductor die. In one embodiment, the semiconductor die includes a plurality of conductive lines and at least one driver which drives at least one of the conductive lines. The drivers are sized to drive to conductive lines, as capacitively loaded by the potting material. In another aspect of the invention, at least one repeater is electrically connected to at least one of the plurality of conductive lines to drive the at least one conductive line as capacitively loaded by the potting material.

In another aspect, an integrated circuit includes means for sensing a capacitive load on the patterned conductive lines of the outer surface of the semiconductor die, as capacitively loaded by the potting material. The integrated circuit also includes means, responsive to the sensing means, for driving the patterned conductive lines at the outer surface of the semiconductor die, as capacitively loaded by the potting material.

In integrated circuits, and designing and fabricating methods according to the present invention, the capacitive effect of the potting material on the semiconductor die may be taken into account by calculating parasitic capacitances for the conductive lines according to the following relationships:

$$C_{total} = \epsilon_P \frac{LH}{d_1} \left( 1 + \frac{p}{(1-2q) \cdot r + 2q} \right) = \epsilon_P \frac{LH}{d_1} \cdot K_{pot}$$

where $$K_{pot} = 1 + \frac{p}{(1-2q) \cdot r + 2q}, \quad p = \frac{d_1}{d_2}, \quad q = \frac{d_3}{d_2}, \quad r = \frac{\epsilon_P}{\epsilon_M},$$

$\epsilon_P$, is the permittivity of insulating layers covering said plurality of conductive lines, $\epsilon_M$ is the permittivity of the potting material, $d_1$ is the distance between an adjacent pair of conductive lines, $d_2$ is the distance between the top portions of the adjacent pair of conductive lines, $d_3$ is the thickness of the insulating layer covering the conductive lines, L is the length of a conductive line, and H is the height of the conductive line and half the width of the conductive line. High speed integrated circuit devices may thereby be provided notwithstanding the use of high permittivity potting materials to pot the integrated circuit.

DETAILED DESCRIPTION OF PREFERRED EMBODIMENTS

Figure 1:
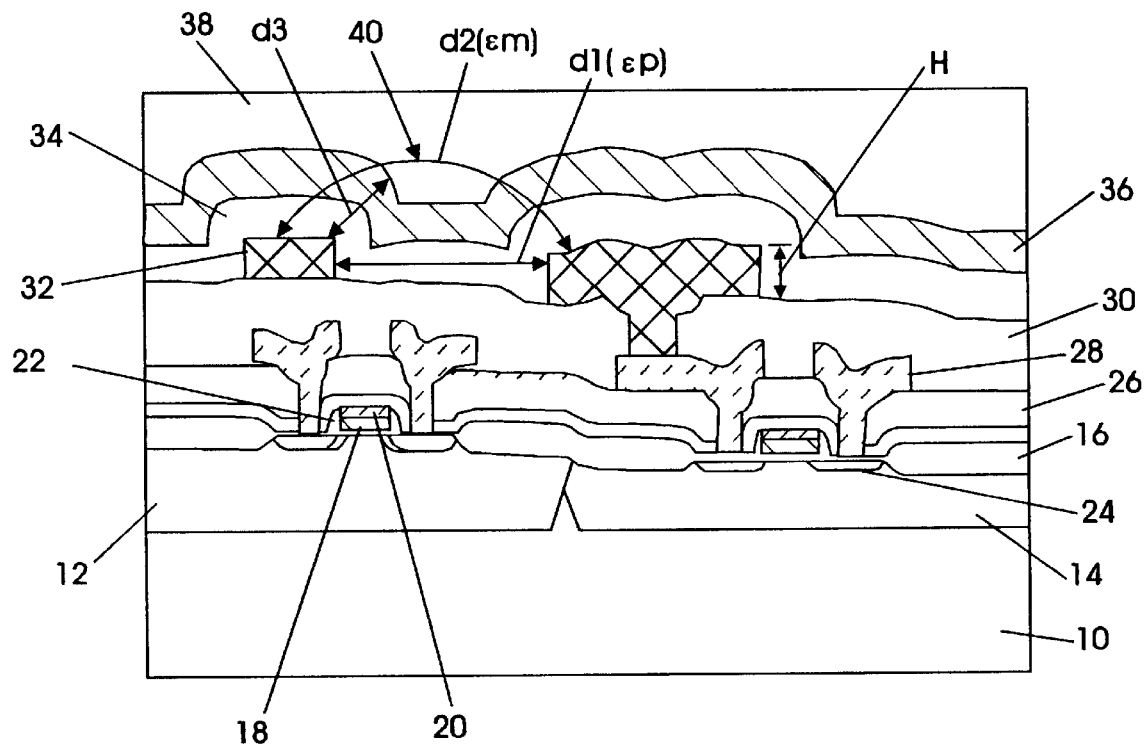
FIG. 1 is a cross-sectional view of a CMOS integrated circuit including a microelectronic substrate, a plurality of patterned conductive interconnect layers and a potting material.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

The present invention provides integrated circuits with improved operating speed by calculating the parasitic capacitance generated in a conductive line, referred to hereinafter as a "metal line" by a potting material, and by analyzing the calculated parasitic capacitance to reduce the parasitic capacitance of the metal line or to increase the driving capability of the metal line.

As will be described in detail below, according to one aspect of the present invention, an integrated circuit includes a plurality of microelectronic devices in a microelectronic substrate and a plurality of metal lines on the semiconductor substrate. A passivation layer covers the plurality of metal lines to a sufficient thickness so as not to be filled with the potting material between the plurality of metal lines.

According to another aspect of the present invention, an output driver which drives the metal lines has sufficiently large driving capability to drive the metal lines notwithstanding the increase in the load by the parasitic capacitance caused by the potting compound material. According to another aspect of the invention, an intelligent driver is provided including a load detector which detects the amplitude of the load caused by a parasitic capacitance on a metal line and an output driver which is responsive to the load detector, having a driving capability which is set in response to the detected output of the load detector.

According to yet another aspect of the present invention, repeaters are formed in the semiconductor substrate at predetermined lengths along at least some of the metal lines to drive the metal lines notwithstanding the increase in parasitic capacitance.

Referring now to FIG. 1, there is illustrated a cross-sectional view of a conventional CMOS integrated circuit. On the surface of a silicon or other substrate 10, a P-type well 12, an N-type well 14, a field oxide layer 16, a gate oxide layer 18, a gate electrode 20, a sidewall spacer 22 and a source/drain region 24 are formed by a typical CMOS manufacturing process to define a transistor. Then, a first planarized insulating layer 26 is formed, and a contact is formed to the source/drain region 24 of the transistor to make a source/drain electrode to a first metal line 28. Thereafter, the first metal line is covered by a second planarized insulating layer 30, and a second metal line 32 is formed on the second planarized insulating layer 30. Then, the second metal line 32 is covered by an outer insulating layer, also referred to as a passivation layer, including a PSG (phosphosilicate-glass) layer 34 and an SiN layer 36, and the passivation layer is covered by a potting compound material 38.

As shown in FIG. 1, in a semiconductor package device fabricated as described above, a recess or space 40 is formed between the second metal lines 32. The recess 40 is filled with the potting compound material 38.

Since the dielectric constant of the potting compound material 38 is greater than that of air which is "1", the parasitic capacitance on the second metal line 32 is increased. Accordingly, a parasitic capacitance larger than an intrinsic parasitic capacitance $C_{interline}$ between the metal lines is generated, and acts as an unexpected parasitic load. Therefore, the output buffer which is designed to drive the intrinsic parasitic capacitance may not operate properly. According to the invention, solutions for this problem are provided.

Figure 2:
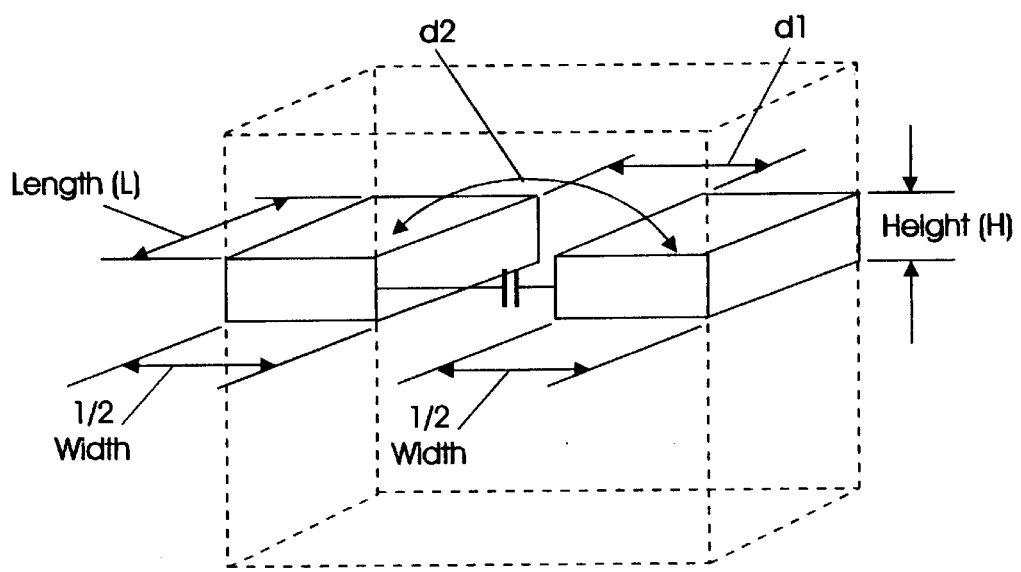
FIG. 2 is a schematic diagram illustrating modeling of parasitic capacitance between conductive lines.

FIG. 2 is a diagrammatic view of the interline capacitance between the metal lines. Referring now to FIGS. 1 and 2, the parasitic capacitance between the metal lines is caused by two primary contributors.

First, there is a parasitic capacitance which is generated when an electric field is created in the closest distance $d_1$ between the metal lines. In this case, the permittivity is measured at the PSG layer 34 and is designated by $\epsilon_P$. The parasitic capacitance is represented by $C_{interline}$ as a common parasitic capacitance.

Second, there is another parasitic capacitance generated by a distance $d_2$ which passes through the PSG layer 34 and the SiN layer 36 and enters the potting compound material.

This parasitic capacitance is taken into account according to the present invention. The permittivities of the PSG layer and the SiN layer are designated by $\epsilon_P$, and the permittivity of the potting compound material is designated by $\epsilon_M$. Since the PSG layer and the SiN layer are similar to each other, their permittivities are nearly the same and therefore commonly designated by $\epsilon_P$.

Figure 3:
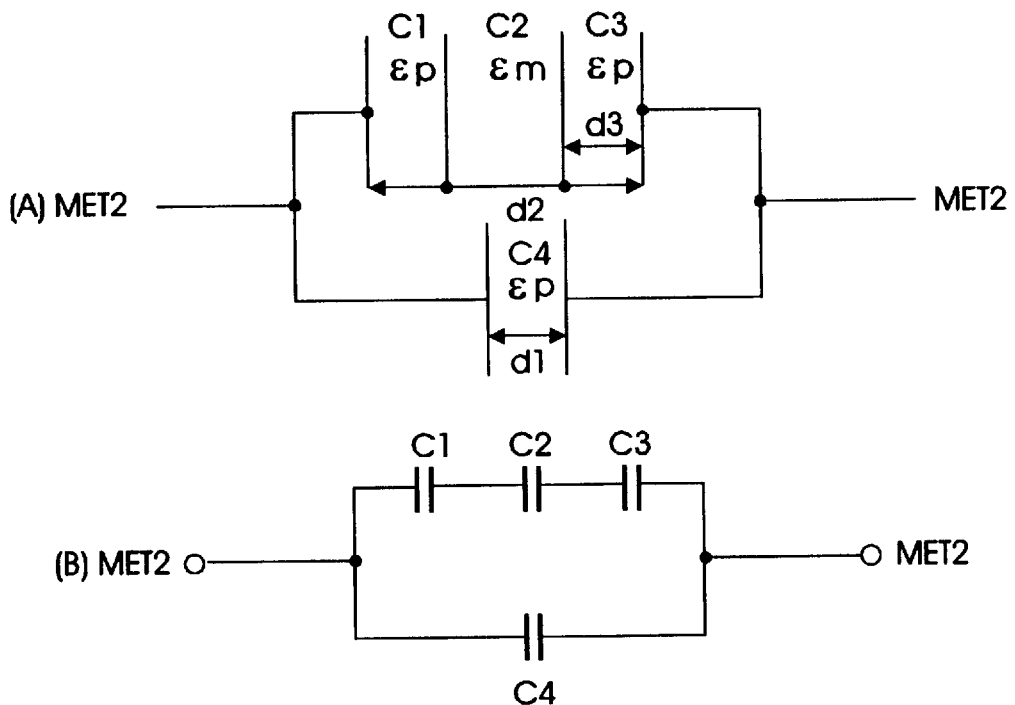
FIGS. 3A and 3B are equivalent circuit diagrams for calculating parasitic capacitance in the model of FIG. 2.

FIGS. 3A and 3B are equivalent circuit diagrams for calculating the parasitic capacitance of the modeling structure of FIG. 2. When the thickness of each passivation layer of the PSG and the SiN layers is designated by $d_3$, each parasitic capacitance can be calculated from the following equations:

$$C_1 = C_3 = \epsilon_P \frac{L(W/2)}{d_3} \quad (1)$$

$$C_2 = \epsilon_M \frac{(LW/2)}{d_2 - 2d_3} \quad (2)$$

$$C_4 = \epsilon_P \frac{LH}{d_1} \quad (3)$$

where $C_4$ is an intrinsic parasitic capacitance which is not influenced by the potting compound material, and other parasitic capacitances are values which are increased by the potting compound material. The total parasitic capacitance can be calculated from the following equation, and is increased by the second term when compared to the intrinsic parasitic capacitance $C_4$:

$$C_{total} = C_4 + \frac{C_1 \cdot C_2 \cdot C_3}{C_1 C_2 + C_2 C_3 + C_3 C_1} \quad (4)$$

When equations (1), (2) and (3) are substituted into equation (4), the total parasitic capacitance is represented by the following equation:

$$C_{total} = \epsilon_P \frac{LH}{d_1} + \frac{\epsilon_M \epsilon_P}{\left(1 - 2\frac{d_3}{d_2}\right) \epsilon_P + 2\left(\frac{d_3}{d_2}\right) \epsilon_M} \cdot \frac{L(W/2)}{d_2} \quad (5)$$

$$p = \frac{d_1}{d_2}, \, q = \frac{d_3}{d_2} \text{ and } r = \frac{\epsilon_P}{\epsilon_M},$$

Assuming that H=W/2, the total parasitic capacitance is finally represented by the following equations:

$$C_{total} = \epsilon_P \frac{LH}{d_1} \left(1 + \frac{p}{(1-2q) \cdot r + 2q}\right) = \epsilon_P \frac{LH}{d_1} \cdot K_{pot} \quad (6)$$

$$K_{pot} = 1 + \frac{p}{(1-2q) \cdot r + 2q} \quad (7)$$

where $k_{pot}$ is a constant which indicates a parasitic capacitance increased by the potting compound material, when compared to the intrinsic parasitic capacitance.

The variation of the parasitic capacitance can be seen by graphically illustrating $K_{pot}$ based on the above equations. In most cases, neglecting slight differences, p is about 0.5. Assuming that q and r are the X-axis and Y-axis, respectively, the resulting graph is shown as in FIG. 4.

Figure 4:
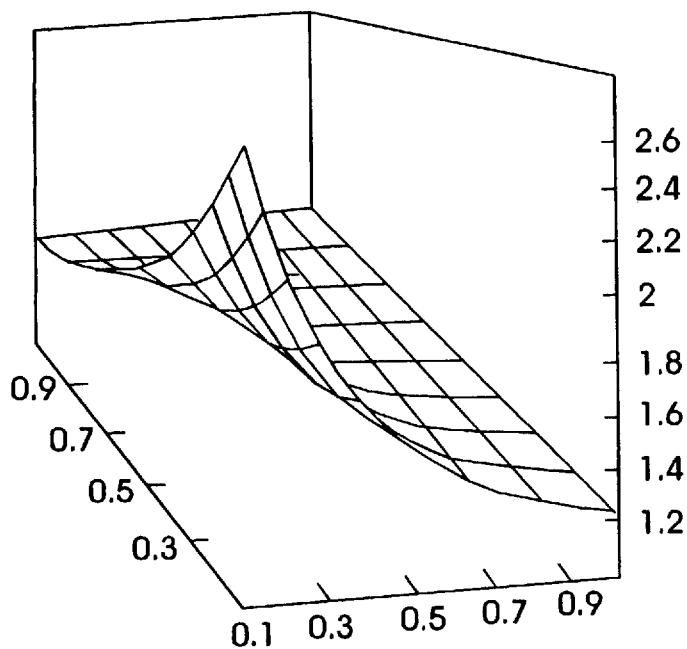
FIG. 4 graphically illustrates an increase in the ratio of parasitic capacitance when the permittivity and width of a potting compound is changed.

Referring to FIG. 4, it can be seen that the total parasitic capacitance increases with a decrease in q and r. That is, the thicker the potting compound material is compared to the PSG and SiN layers, and the larger the permittivity of the potting compound material compared to the PSG layer, the more $K_{pot}$ is increased.

Assuming that the thickness and permittivity of the potting compound material are increased by a factor of 10, the total parasitic capacitance is increased by a factor of 3, as shown in FIG. 4. However, the total parasitic capacitance is generally increased by a factor of about 1.3 to about 2.

According to the invention, the parasitic capacitance of the potting compound material may be reduced by increasing the thickness of the PSG layer, to thereby reduce the amount of the potting compound material which is extends between the metal lines. Note that to fill the PSG layer to a sufficient height, an oxidation process may need to be implemented for a long time, and the bottom layer or the passivation layer may be adversely impacted.

According to another aspect of the invention, a large and powerful driver is designed and fabricated, to drive a load larger than that conventionally designed and fabricated for an output stage.

According to another aspect of the invention, an intelligent driver capable of actively sensing the load of the output stage can be designed and fabricated. The intelligent driver can adjust its performance by sensing the magnitude of the load of the output stage. Specifically, a load detector detects the magnitude of the load generated by the parasitic capacitance of each metal line. An output driver includes a driving capability which is set in response to a detected output of the load detector.

Finally, the length of conductive lines such as output buses can be limited, to limit the capacitance. If long lengths are required, a level repeater can be inserted in the conductive lines so as not to drive a large load.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit comprising:

a plurality of microelectronic devices in a microelectronic substrate;

a plurality of conductive interconnect layers on said microelectronic substrate, said plurality of microelectronic layers including an outer conductive interconnect layer having a plurality of conductive regions;

a passivating layer on said outer conductive interconnect layer, which fills the spaces between the plurality of conductive regions in said outer conductive layer; and a potting material on said passivating layer, said passivating layer blocking said potting material from extending between said plurality of conductive regions in said outer conductive layer so that the capacitive load of the potting material on the outer conductive interconnect layer is eliminated.

2. An integrated circuit according to claim 1 wherein said passivating layer comprises glass.

* * * * *